(12) United States Patent
Kato

(10) Patent No.: US 6,813,404 B2
(45) Date of Patent: Nov. 2, 2004

(54) INTEGRATED OPTICAL MODULE

(75) Inventor: Tomoaki Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 160 days.

(21) Appl. No.: 10/100,110

(22) Filed: Mar. 19, 2002

(65) Prior Publication Data

US 2002/0150320 A1 Oct. 17, 2002

(30) Foreign Application Priority Data

Mar. 19, 2001 (JP) .................................... 2001/079481

(51) Int. Cl.[7] .............................. G02B 6/12; G02B 6/26; G02B 6/32; G02B 6/10
(52) U.S. Cl. .............................. 385/14; 385/27; 385/31; 385/33; 385/39; 385/129
(58) Field of Search .............................. 385/14, 31, 33, 385/129, 27, 39

(56) References Cited

U.S. PATENT DOCUMENTS 5,943,459 A    8/1999  Hildebrand et al.
6,243,516 B1 * 6/2001  Seino .......................... 385/47

FOREIGN PATENT DOCUMENTS

EP   0 455 334   11/1991
JP   05 297244   11/1993

OTHER PUBLICATIONS

"Hybrid Integrated 8 Channerl SOAG Array Receptacle Module with Driver ICs (1)—Structure and Characteristics—" Electronic Society Conference of IEICE, C–3–35, Sep. 1999.

T. Tamanuki et al., "Angled facet spot–size–converter integrated SOA with S–shaped waveguide", Indium Phosphide and Related Materials, 1998 International Conference on Tsukuba, Japan, May 11–15, 1998, New York, NY, IEEE, May 11, 1998, pp. 435–438.

* cited by examiner

Primary Examiner—Frank G. Font
Assistant Examiner—Michael P. Mooney
(74) Attorney, Agent, or Firm—Young & Thompson

(57) ABSTRACT

An integrated optical module includes an optical waveguide circuit or input and output optical waveguides, a platform, an optical waveguide element or semiconductor amplifiers, and a wave front compensation mechanism. The optical waveguide circuit or optical waveguides guide signal light. The platform has a major surface where the optical waveguide circuit or optical waveguides are formed, and a first end face where the signal light passing through the optical waveguide circuit or optical waveguides emerges and becomes incident. The optical waveguide element or semiconductor amplifiers are mounted on the platform and have a second end face opposing the first end face through a predetermined air gap. The wave front compensation mechanism is integrally formed with the platform at a region of the first end face where the signal light becomes incident and emerges, to decrease a curvature of a wave front of the incident/exit signal light.

14 Claims, 4 Drawing Sheets

INTEGRATED OPTICAL MODULE

BACKGROUND OF THE INVENTION

The present invention relates to an integrated optical module in which an optical waveguide element is mounted on a platform (base) having an optical waveguide circuit.

As the demand for a broadband multimedia communication service such as the Internet increases explosively, development of a larger-capacity, higher-performance optical fiber communication system is sought for. The number of optical communication modules used in such a large-scale system increases more and more as the system size increases. Not only the number of optical communication modules but also the size thereof increases the cost and mounting load of the optical communication modules occupying the whole system to a non-ignorable degree. Therefore, size reduction, function integration, and cost reduction of the optical communication modules themselves are very critical problems.

As a countermeasure that solves the above problems, demand has arisen for a photonic integrated circuit (PIC) in which a plurality of optical elements are monolithically integrated on one substrate to realize a specific function, and optical and electrical integrated modules in which peripheral electronic circuit elements for driving an optical element are integrated. In particular, a hybrid optical integrated module in which an optical waveguide element is flip-chip mounted on a platform having an optical waveguide circuit is promising in terms of productivity and the like as an optical integration technique which is the most practical technique.

In an optical module manufactured by using such a hybrid optical integration technique, the signal input/output end faces of an optical waveguide circuit and optical waveguide element formed on one platform oppose each other through a narrow air gap. In this air gap, mode field mismatching occurs between the two optical waveguides. A coupling efficiency caused by mode field mismatching is larger than that obtained with an aspherical lens or the like. This fact poses an issue in the hybrid optical integrated module when the module is to be applied to a high-end optical communication module aimed at a trunk optical fiber communication system, or an optical amplifier module.

To solve the problem of coupling loss in the hybrid optical integrated module described above, the following two methods are conventionally used. According to the first method, an air gap portion where the signal light incident/exit end face of an optical waveguide element and that of an optical waveguide circuit on the platform oppose is filled with a refractive index matching material such as a resin. According to the second method, in an optical waveguide element, for example, the sectional shape of a core layer in the vicinity of the signal light incident/exit end faces is changed along the longitudinal axis, so that the optical waveguide element has a spot size converting function.

Of the two methods, the first method using the refractive index matching material is performed by making a potting resin, which is originally used when hermetically sealing an optical waveguide element in order to increase the reliability, serve also to match the refractive index. This method has already been generally employed in a subscriber optical transmitting/receiving module. However, the refractive index of a medium that surrounds the optical waveguide element differs largely from that of air, and the effective end face reflectance of the optical waveguide element is inevitably largely adversely affected. Hence, when a refractive index matching material is to be used, the conditions (refractive index and thickness) of forming the end face coating of the optical waveguide element must be changed in advance in accordance with the refractive index of the refractive index matching material to fill.

As a result, the optical waveguide element performs originally designed operation only after filling the air gap with the refractive index matching material. The element characteristics of the optical waveguide element, before the optical waveguide element is flip-chip mounted on the optical waveguide platform cannot be evaluated or selected in advance which is a fundamental drawback. In particular, in hybrid optical integration of a semiconductor optical amplifier in which residual end face reflection must be minimized as much as possible, the end face coating does not serve as a low-reflecting film in a state before flip-chip mounting. In this case, a large ripple appears in the gain spectrum of the semiconductor optical amplifier, and the semiconductor optical amplifier does not operate properly as originally designed.

Also, in the semiconductor optical amplifier, an oblique optical waveguide structure or the like in which active layer stripes are inclined in the vicinity of the signal light incident/exit end face with respect to the direction of the normal to the end face is used to suppress residual end face reflection. In this case, however, as the air gap is filled with a refractive index matching material, the angle of refraction of the signal light changes in the air gap, and the optimal coupling position to the end face of an opposite optical waveguide circuit is undesirably shifted. Because of these reasons, in hybrid optical integration of a semiconductor optical amplifier, the countermeasure of improving the coupling efficiency by means of a refractive index matching material cannot be used.

The latter method employing the spot size converting function is also widely used as a countermeasure of improving the coupling efficiency of an integrated optical module. For example, a coupling efficiency of about −1 dB to −2 dB is obtained when a quartz-based optical waveguide is coupled to a single mode semiconductor laser, and a coupling efficiency of about −4 dB to −5 dB is obtained when it is coupled to a semiconductor optical amplifier. A coupling efficiency of this degree does not pose a serious problem in, e.g., a subscriber optical transmitting/receiving module that requires comparatively low performance requirements for an optical module. When, however, the hybrid optical integrated module is to be applied to a high-end optical module to be built into a trunk optical fiber communication system, a further improvement in coupling efficiency is desired. Currently, the application range of the hybrid optical integration technique is entirely limited to a low-cost optical module for a subscriber optical communication system.

SUMMARY OF THE INVENTION

It is, therefore, an object of the present invention to provide an integrated optical module in which the signal light coupling efficiency between an optical waveguide element and optical waveguide circuit with signal light incident/exit end faces opposing each other through an air gap is improved more effectively than in the prior art.

It is another object of the present invention to provide an integrated optical module in which size reduction, cost reduction, and improvement in mass productivity are realized.

In order to achieve the above object, according to the present invention, there is provided an integrated optical module comprising an optical waveguide circuit for guiding signal light, a base with a major surface where the optical waveguide circuit is formed, the base having a first end face where the signal light passing through the optical waveguide circuit emerges and becomes incident, an optical waveguide element mounted on the base and having a second end face opposing the first end face through a predetermined air gap, and a wave front compensating portion integrally formed with the base at a region of the first end face where the signal light becomes incident and emerges, to decrease a curvature of a wave front of the incident/exit signal light.

DESCRIPTION OF THE PREFERRED EMBODIMENTS

The present invention will be described with reference to the accompanying drawings.

Figure 1A:
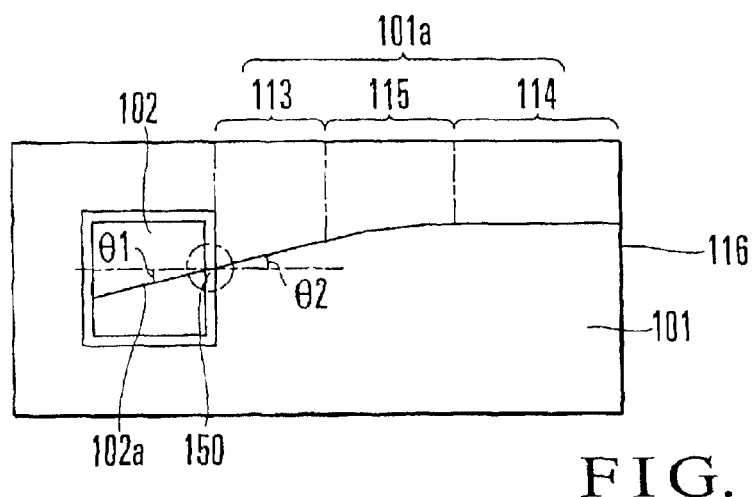
FIG. 1A is a plan view of an integrated optical module according to the first embodiment of the present invention.
Figure 1B:
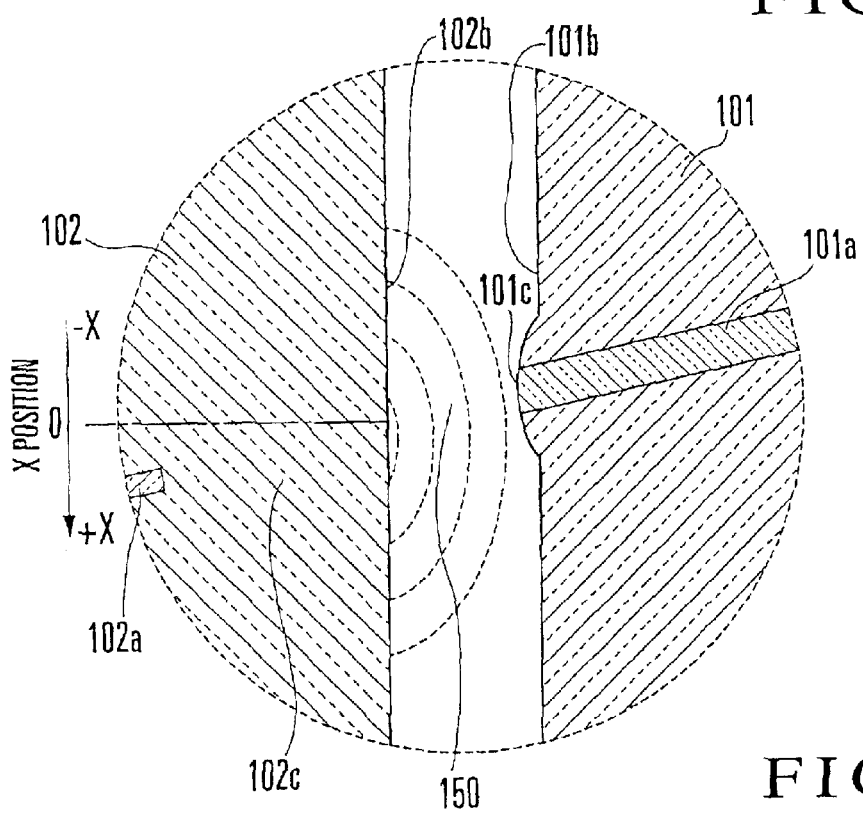
FIG. 1B is an enlarged view of the main part of FIG. 1A.
Figure 1C:
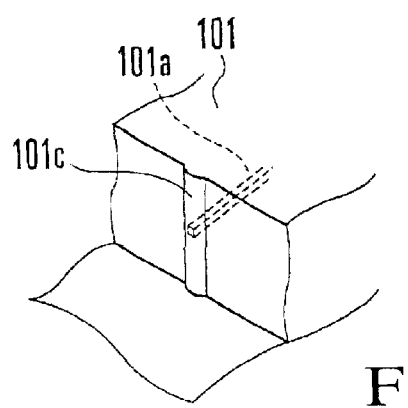
FIG. 1C is a partial perspective view of the integrated optical module shown in FIG. 1A.

FIGS. 1A to 1C show the arrangement of an integrated optical module according to the first embodiment of the present invention. As shown in FIGS. 1A and 1B, in this integrated optical module, an optical waveguide element 102 with an optical waveguide 102a for guiding signal light obliquely to an end face 102b where the signal light becomes incident and emerges is mounted on a platform (base) 101 with an optical waveguide circuit 101a made of a quartz-based material. In this case, the platform 101 serves as the core of the optical waveguide circuit 101a.

The optical waveguide circuit 101a is formed of a core layer made of germanium-doped quartz and a cladding layer made of phosphorus- or boron-doped quartz. That end face 101b of the optical waveguide circuit 101a where the signal light becomes incident and emerges, and the end face 102b oppose each other through an air gap 150 to form a coupling system. In place of a quartz-based material, a transparent resin such as polyimide fluoride or polymethyl methacrylate may be used as the material of the cladding and core which make up the optical waveguide circuit 101a.

The optical waveguide 102a is formed in a plane parallel to the platform 101 to form an angle θ1 with respect to the end face 102b. The angle θ1 is appropriately within an angle of 5° to 7° but can exceed 8°. In this case, the optical waveguide 102a becomes difficult to manufacture. The distal end of the optical waveguide 102a is tapered such that its thickness gradually decreases toward the end face 102b. A window region 102c between the distal end of the optical waveguide 102a and the end face 102b has a length of about 25 μm.

The optical waveguide circuit 101a has an effective refractive index different from that of the optical waveguide element 102, and couples incident/exit signal light with the optical waveguide element 102. The optical waveguide circuit 110a is comprised of an oblique region 113 formed with an angle θ2 with respect to the perpendicular of the end face 101b, a linear region 114 formed parallel to the perpendicular of the end face 101b, and a curved region 115 for smoothly connecting the oblique region 113 and linear region 114 and having an appropriate curvature with which the influence of radiation can be ignored, in a plane parallel to the platform 101.

The angle θ2 is substantially determined from an equivalent refractive index n1 and the angle θ1 of the optical waveguide 102a and an equivalent refractive index n2 of the oblique region 113 by using Snell's law of the angle of refraction. The linear region 114 extends to an end face 116 of the platform 101. The optical waveguide element 102 is mounted on the platform 101 to form the air gap 150 with a predetermined length (10 μm) between the end faces 102b and 101b.

As shown in FIG. 1C, the end face 101b has a projecting one-dimensional wave front compensation mechanism 101c for changing the phase distribution in the horizontal direction of signal light which has been propagated through the air gap 150. The one-dimensional wave front compensation mechanism 101c has the shape of a circular cylinder (partial circular cylinder) cut at a certain plane perpendicular to its bottom surface. The bottom surface of the partial circular cylinder forms one plane together with the bottom surface of the air gap 150, and the upper surface of the partial circular cylinder forms one plane together with the upper surface of the platform 101. In other words, the one-dimensional wave front compensation mechanism 101c is continuously formed from the upper surface of the platform 101 to the bottom surface of the air gap 150. The one-dimensional wave front compensation mechanism 101c is integrally formed at the distal end of the optical waveguide circuit 110a when forming the end face 101b. In other words, the distal end of the optical waveguide circuit 101a is arranged at a region where the one-dimensional wave front compensation mechanism 101c is formed.

Signal light incidence and exit in the coupling system of the optical integrated module described above will be described. Signal light guided along the optical waveguide 102a and radiated from the end face 102b toward the air gap 150 reaches the end face 101b of the optical waveguide circuit 101a. At this time, the curving of the phase distribution which occurs during propagation through the air gap 150 is restored to a shape close to the phase distribution of a plane wave by the one-dimensional wave front compensation mechanism 101c, and is coupled to the fundamental propagation mode of the optical waveguide circuit 101a.

As a result, the coupling efficiency is greatly improved when compared to a case wherein an optical waveguide circuit platform with a flat end face is used as in the conventional case. The improving performance of the coupling efficiency by the one-dimensional wave front compensation mechanism 101c is substantially determined by the curvature of the concave or convex shape, and is less adversely affected by the thickness of the concave or convex shape.

The one-dimensional wave front compensation mechanism 101c can be integrally formed at high precision during formation of the end face 101b. The optical waveguide element 102 can be mounted at high precision by self-alignment. Hence, according to this embodiment, the coupling efficiency can be greatly improved at all coupling portions regardless of the number of optical elements or the number of channels to be mounted on the platform 101.

According to this embodiment, in the integrated optical module in which the optical waveguide element 102 is flip-chip mounted on the platform 101 of the optical waveguide circuit 101a, the wave front compensation mechanism (wave front matching mechanism) 101c for correcting the equiphase front (wave front) of the signal light one-dimensionally only in an axial direction parallel to the optical waveguide circuit 101a is formed on the signal light incident/exit end face of the platform 101 having the optical waveguide circuit 101a. Although the one-dimensional wave front compensation mechanism 101c has the shape of a partial circular cylinder in FIG. 1C, the present invention is not limited to this shape. That portion projecting from the end face 101b need not form a curved surface but may form a polyhedron formed by combining flat surfaces. For example, the wave front compensation mechanism can form a triangular pyramid.

In the manufacturing process of the platform, the optical waveguide circuit is partially removed to form an optical waveguide element mounting portion on it, and a signal light incident/exit end face is formed. In this end face forming step, the wave front compensation mechanism can form a signal light equiphase front (wave front) on the incident/exit end face integrally and simultaneously with the optical waveguide circuit.

More specifically, in the end face forming step, the pattern shape of an etching inhibition mask is devised and vertical etching is performed, so a wave front matching mechanism not with a planar end face but with an end face having an arbitrary one-dimensional concave or convex shape can be integrally formed. In this embodiment, the wave front matching mechanism has a partial circular cylindrical shape. Thus, a wave front matching mechanism can be formed easily without requiring complicated machining during formation of the end face.

Generally, a coupling efficiency between two different optical waveguides is given by complex multiple integration of respective normalized specific propagation mode fields. This means an ideal high coupling efficiency can be realized when the field strength distributions of the respective mode fields are matched as well as the phase distributions.

With the conventional coupling efficiency improving countermeasure by means of spot size conversion, only the field strength distributions, of the two mode fields between the optical waveguide and optical waveguide circuit, are mainly set close to each other, and an effect of setting their phase distributions close to each other cannot be expected much. Although a certain coupling efficiency improving effect can naturally be obtained in this case, mismatching of the two phase distributions largely adversely affects the behavior of complex multiple integration, and accordingly largely impairs the coupling efficiency improving effect.

Figure 2:
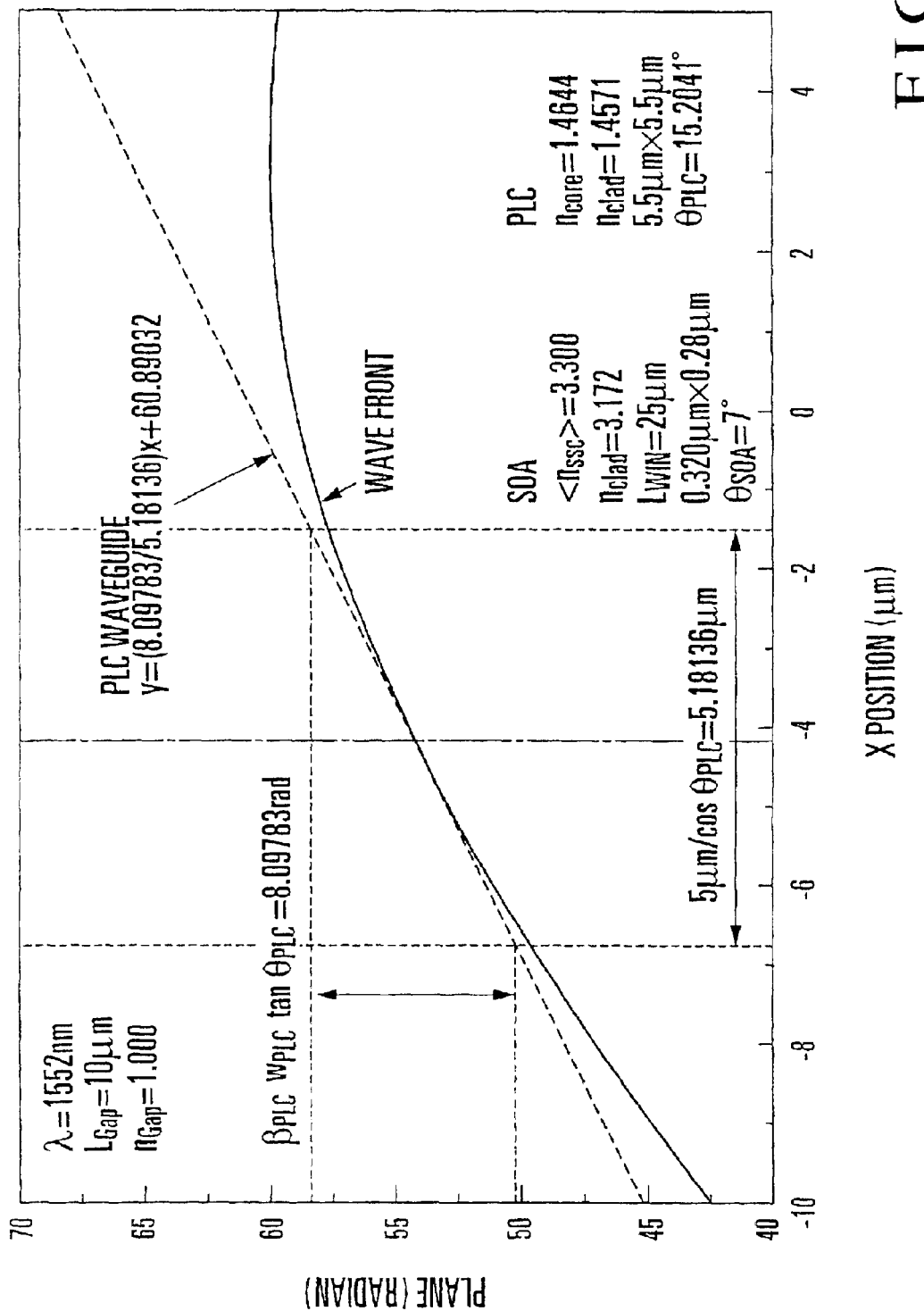
FIG. 2 is a graph showing the phase distribution of a semiconductor optical amplifier with a spot size converter, which employs both an oblique optical waveguide structure and window structure, at the height of core center in a direction parallel to a substrate, and the phase distribution in the horizontal direction of the fundamental propagation mode of a semiconductor optical waveguide at the height of core center.

This will be described with reference to the analytic result of a three-dimensional electromagnetic field in the coupling system of an actual integrated optical module. FIG. 2 shows the phase distribution of signal light with a wavelength of 1,550 nm emitted from a semiconductor optical amplifier with a spot size converter which employs both an oblique optical waveguide structure and window structure (Kato et al., the Society Conference of the Institute of Electronics, Information and Communication Engineers, 1999), at the height of core center in an air gap separate from the end face by 10 $\mu$m in a direction parallel to the substrate (to be referred to as the horizontal direction hereinafter) and the phase distribution in the horizontal direction of the fundamental propagation mode of a quartz optical waveguide at the height of core center. Assume that the oblique angle of the active layer stripes in the vicinity of the incident/exit end is 7° ($\theta$1), the length of the window region is 25 $\mu$m, and the oblique angle ($\theta$2) of the quartz optical waveguide is set to about 15.2° from Snell's law of the angle of refraction.

The wave front of signal light, which passes through the optical waveguide 102a of the optical waveguide element 102, e.g., a semiconductor optical amplifier, emerges from the end face 102b, and then propagates through the air gap diverges almost semispherically, as shown in FIG. 1B. The phase distribution in the horizontal direction of the signal light, diverging semispherically from the wave front, at a position where the signal light reaches the signal light incident/exit end face of the optical waveguide circuit 101a as the quartz waveguide forms a parabolic curve, as indicated by a solid line in FIG. 2.

The phase distribution in the horizontal direction of the specific propagation mode (TE fundamental mode in this case) of the optical waveguide circuit 101a at the incident end is linear. Therefore, even when the two phases are matched at the core center, phase mismatching increases toward the peripheral portion. This is the main factor that suppresses the coupling efficiency to about −4 dB to −5 dB at best when a spot size converter is used.

If the undesirably distorted signal light phase distribution is subjected to some correction so it is restored linearly at the incident end of the optical waveguide circuit 101a, the matching effect of the field strength distributions which is originally expected of the spot size converter itself will be maximized. Usually, a lens is used for such wave front compensation. However, to form a lens on the optical waveguide platform increases the number of components. Also, it is very difficult to mount a very small lens with high positional precision in an air gap between the optical waveguide element and optical waveguide circuit which is merely about 10 $\mu$m.

A technique of forming a two-dimensional lens by chemical etching such that the core portion of a quartz optical waveguide circuit projects is also known. However, chemical etching has large planar variations, and lacks in a degree of freedom necessary for designing a lens shape to be most effective for wave front compensation. A method of forming a lens by blowing a resin to an end face by an ink-jet technique is also proposed. With this method, however, the lens shape is limited, and a nonplanar process is introduced in the optical waveguide platform manufacturing process. Thus, this method may be unrealistic from the viewpoint of practical use. To apply the hybrid optical integration technique widely to the optical module as a whole, development of the optical integration technique in which mass productivity and inspecting operation in the manufacturing process are considered as well as a high performance is significant.

In the optical integrated module according to this embodiment, in the step of forming the end face of a platform having an optical waveguide circuit, a one-dimensional wave front compensation mechanism with a shape (partial circular cylinder) obtained by cutting a circular cylinder at a certain plane perpendicular to the bottom surface is integrally formed. The one-dimensional wave front compensation mechanism compensates for the wave front in the horizontal direction with respect to the signal light. In other words, the wave front compensation mechanism decreases the curvature of the wave front of the signal light at a position where the wave front reaches the incident/exit end face. Although the above embodiment can perform wave front compensation only in the horizontal direction, this alone can remarkably improve the actual coupling efficiency.

The wave front compensation performance can be calculated with practically sufficiently high precision. Hence, a concave or convex shape that can realize the highest coupling efficiency can be obtained by calculation in advance, and can be reflected easily in the pattern shape of the etching inhibition mask. Naturally, the curve which forms this concave or convex shape need not be that of a continuous function, and a curve like that of a one-dimensional Fresnel lens can be formed easily. In this manner, when compared to a cylindrical lens single body manufactured by mechanical polishing or the like, the degree of design freedom necessary for obtaining the wave front compensation performance can be improved.

The mask pattern can be designed easily by subjecting an arbitrary concave or convex shape obtained by calculation to simple CAD (Computer Aided Design) operation. No new step need be added to the optical waveguide circuit platform manufacturing process to merely realize a wave front compensation mechanism. Accordingly, the number of components does not increase, and high-precision optical axis aligning operation in the assembly step is not needed at all. In this manner, according to the present invention, when improving the coupling efficiency, the productivity and cost reduction are not interfered with at all.

A method of forming some concave or convex shape on the signal light incident/exit end face of an optical waveguide single body is also reported. In this case, the coupling efficiency with another optical waveguide element is improved merely slightly. With this method, cumbersome optical axis aligning operation is still needed. Considering packaging which is indispensable when actually incorporating an optical waveguide single body in an optical communication system, special jigs and attaching components are additionally needed for performing cumbersome optical axis aligning operation in a narrow environment of a limited space in a package. In this manner, the method of forming some concave or convex shape on the signal light incident/exit end face of the optical waveguide single body is apparently against the technical trend of reducing the cost of the optical module by decreasing the number of components or number of operation steps, and is obviously unrealistic from the viewpoint of practical use.

In the hybrid optical integrated module, the self alignment technique using AuSn solder bumps and the like can be maximally utilized. High-precision multi-chip batch mounting in which the relative alignment precision after flip-chip mounting is suppressed to ±1 µm or less can be realized very easily. The high-precision multi-chip batch mounting technique is the most significant technique in maximally obtaining the performance of an optical waveguide end face, where a wave front compensation mechanism in the horizontal direction, which is the characteristic feature of the present invention, is integrally formed at high precision. A practical performance can be exhibited only when the wave front compensation mechanism and optical waveguide end face are incorporated in the hybrid integrated module simultaneously.

To form an end face integrally having a concave or convex shape which forms a wave front matching mechanism, first, a metal film made of chromium (Cr) or the like is formed on the optical waveguide layer as an etching inhibition mask. Subsequently, a necessary one-dimensional concave or convex shape is patterned at high precision by using an exposure apparatus or the like, and is etched. The etching process may use the Inductively Coupled Plasma (ICP) etching technique. Even on a thick optical waveguide layer that exceeds 30 µm, an ideal end face, which is highly perpendicular and in which the roughness of the etching surface is suppressed to an ignorable degree as compared to the scale of the signal light wavelength, can be sufficiently formed.

These process technique and manufacturing apparatus are very common in the silicon semiconductor integrated circuit process. Hence, no technical obstacle particularly exists in the manufacture of an optical waveguide circuit platform, and these process technique and manufacturing apparatus can be developed to mass production easily. The perpendicularity of etching during formation of the end face may be slightly decreased, and the end face may be intentionally slightly inclined, so a phase change in the direction of layer thickness can be imparted. Simplified phase distribution control in the direction of layer thickness can thus be realized.

Similarly, it is supposed that, after the concave or convex which is to take charge of wave front compensation in the horizontal direction is formed, if a technique of forming the core layer of the optical waveguide circuit to project from the cladding layer by an amount almost corresponding to the signal light wavelength by using chemical etching is performed in combination, an almost ideal two-dimensional wave front compensation mechanism may be realized.

Figure 5:
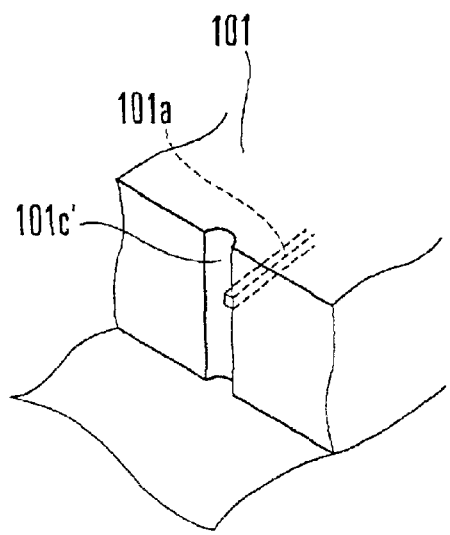
FIG. 5 is a view showing another example of the one-dimensional wave front compensation mechanism shown in FIG. 1C.

Although the wave front of the signal light emerging from the optical element and propagating through the air gap forms a convex toward the light-receiving optical waveguide circuit in the above description, it may form a concave in some cases. Then, as shown in FIG. 5, a wave front compensation mechanism 101c' with a concave on the end face of an optical waveguide circuit may be formed. For example, as a concave, a groove is formed with a shape obtained by cutting a partial circular cylinder from the end face. In this case, the section of the groove forms an arc, and the groove is continuously formed from the upper surface of the platform to the bottom surface of the air gap.

According to this embodiment, even a high-end optical waveguide element for a trunk optical fiber communication system, which has not been employed from the viewpoint of coupling loss, can form an integrated optical module. The number of optical components such as an aspherical lens and the area where the optical components are to be set can be reduced, and cumbersome optical axis aligning operation can be omitted, so a smaller-size, higher-performance, lower-price integrated optical module can be provided in a large amount and stably. These lead to a larger-size, higher-function trunk optical fiber communication system aimed at making a next-generation communication network.

In the above embodiment, the optical waveguide 102a of the optical waveguide element 102 is formed at an angle of 5° to 7° with respect to the normal to the end face 102b. This will be described in detail. In a semiconductor optical element such as an LD (Laser Diode) or SOA (Semiconductor Optical Amplifier) which is incorporated in an optical waveguide circuit as described above, if the longitudinal axis of the core is perpendicular to the end face, the longitudinal axis of the optical waveguide that opposes the semiconductor optical element through the air gap also becomes perpendicular to the signal light incident/exit end face. Consequently, the two end faces opposing each other through the air gap form a Fabry-Perot resonator. When the longitudinal axis of the core of the semiconductor optical element is perpendicular to the end face, a composite resonator structure, in which the resonator formed by the two end faces of the air gap is vertically connected between two optical waveguides, is formed.

In the composite resonator structure described above, light returning to the semiconductor element makes the oscillating state of a light source element such as an LD very unstable, thus degrading the performance as the light source module. When the reflectance of the end face of the LD is decreased, while the influence of composite resonance is decreased, the oscillated light output and threshold current of the LD itself are largely adversely affected. Hence, the countermeasure of forming a low-reflecting film has its limitations.

When passive optical waveguides are optically coupled to be opposite to each other, as the Fabry-Perot resonator shows a wavelength dependence on the transmission characteristics, the apparent coupling efficiency between the two optical waveguides largely changes undesirably upon a change in gap width or equivalent signal light wavelength. When the passive optical waveguides are to be coupled to each other, low-reflecting films may be formed on their end faces. When, however, one optical waveguide is a PLC (Planar Lightwave Circuit) platform, a low-reflecting film need be formed on its light signal incident/exit end face which is cut perpendicularly. Due to the coating characteristics of the low-reflecting film to be formed and the consistency with the process of forming the low-reflecting film, a large cost increase and yield decrease may occur.

When the wave front compensation mechanism for compensating for a wave front phase is to be applied to the PLC platform of an optical module aimed at the trunk optical fiber communication system, the above problems must be considered, and an oblique waveguide structure in which the two optical waveguides are inclined with respect to the normals to the respective signal light incident/exit end faces is desirably employed.

Figure 3A:
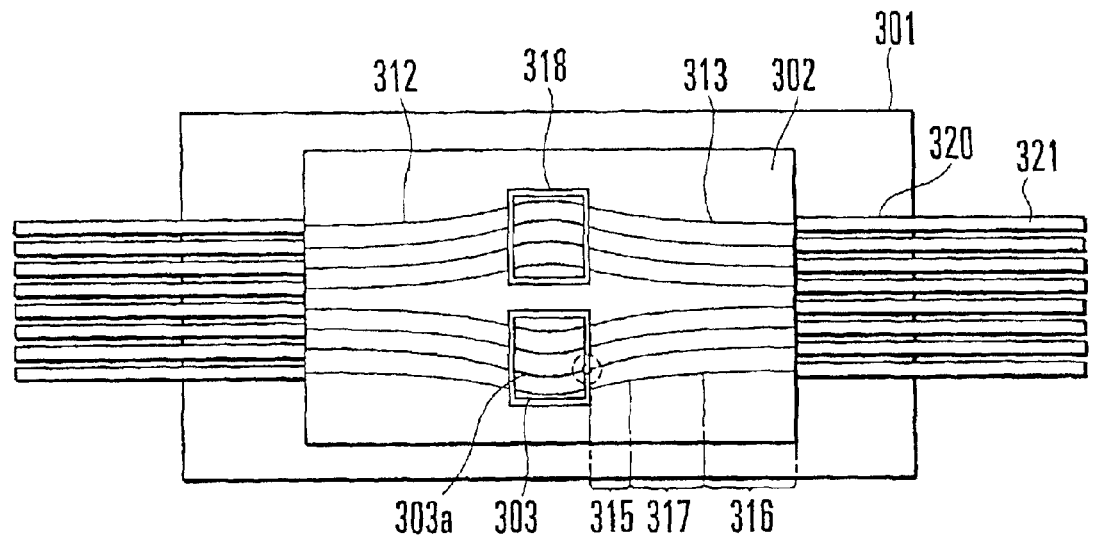
FIG. 3A is a plan view of an integrated optical module according to the second embodiment of the present invention.
Figure 3B:
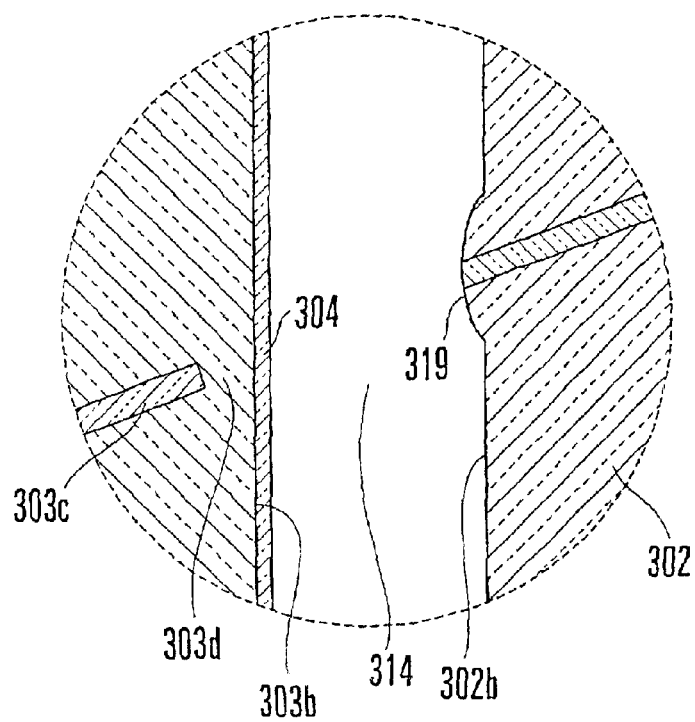
FIG. 3B is an enlarged view of the main part of FIG. 3A.

FIGS. 3A and 3B show the arrangement of an integrated optical module according to the second embodiment of the present invention. In this embodiment, the integrated optical module shown in FIGS. 1A to 1C is applied to a hybrid optical integrated module for an array type semiconductor optical amplifier (SOA).

In the hybrid optical integrated module shown in FIG. 3A, a quartz platform 302 and two semiconductor optical amplifiers 303 are monolithically mounted on a silicon substrate 301. Two sets of ribbon optical fibers in which eight waveguides are separated into two sets each containing four waveguides are formed on the platform 302 to correspond to the two semiconductor optical amplifiers 303. Each semiconductor optical amplifier 303 has four channels for amplifying signal light independently of polarization.

In the semiconductor optical amplifier 303, active layer stripes 303a, comprised of an undoped InGaAs bulk structure with a wavelength composition of 1,550 nm which is formed on an n-InP substrate having a (001) plane as the major surface, are buried in a p-InP cladding layer. The active layer stripes 303a are arranged in four at an interval of 250 $\mu$m, and respectively amplify signal light independently of polarization.

The semiconductor optical amplifier 303 forms a single-mode optical waveguide with respect to 1,550-nm signal light, and serves to optically amplify the signal light upon injection of a current. To decrease the polarization dependency for the signal light, each active layer stripe 303a is formed with a height of 0.32 $\mu$m and a width of 0.28 $\mu$m, so that the aspect ratio of its section becomes almost 1:1.

The element length of the semiconductor optical amplifier 303 is 900 $\mu$m. Of the element length, the length of that linear region of each active layer stripe 303a which is parallel to the [110] direction of the n-InP substrate is 370 $\mu$m. On the two ends of the linear region, oblique regions inclined in the same direction with respect to the [110] direction of the n-InP substrate by 7° are formed for a length of 200 $\mu$m. The linear region and oblique regions are smoothly connected to each other through curved regions each with a radius of curvature of 4 mm with which radiation loss can be ignored.

The semiconductor optical amplifier 303 has a window region 303d, where no active layers are formed, extending from its end face 303b into the interior of the element for 15 $\mu$m. Each oblique region of the active layer stripe 303a has a spot size converting regions 303c in which the thickness of the active layer stripe 303a is gradually decreased to ⅓ toward the distal end. These components are all formed by selective MOVPE (Metal Organic Vapor Phase Epitaxial) growth. Low-reflecting films 304 with a reflectance of 0.1% against signal light are formed on the two end faces 303b, respectively, of the semiconductor optical amplifier 303.

On the platform 302 mounting the semiconductor optical amplifiers 303 thereon, as shown in FIG. 3A, eight quartz-type input optical waveguides 312 and eight output optical waveguides 313, formed on the silicon substrate 301 by atmospheric-pressure CVD (Chemical Vapor Deposition), are arranged as two arrays each containing four waveguides to be biaxially symmetrical. In each of the input and output optical waveguides 312 and 313, a Ge-doped core with a 5.5-$\mu$m square section is buried between the upper and lower cladding layers each with a thickness of 12 $\mu$m, thus forming a single-mode optical waveguide against 1,550-nm signal light.

The input and output optical waveguides 312 and 313 have oblique regions 315, linear regions 316, and curved regions 317 so the incident/exit signal light is coupled to the semiconductor optical amplifiers 303 efficiently. Each oblique region 315 is bent by about 15.2° with respect to an end face 302b on a plane parallel to the silicon substrate 301. Each curved region 317 is moderately bent with a radius of curvature of 10 mm, with which the influence of radiation can be ignored, in order to smoothly connect the curved region 317 and linear region 316 to each other.

An optical element mounting region 318 is formed between the input and output optical waveguides 312 and 313 to extend for a length of 920 $\mu$m, so the semiconductor optical amplifiers 303 can be mounted on it. On the end face 302b of the platform 302 opposing the optical element mounting region 318, one-dimensional wave front compensation mechanisms 319 with a thickness of 3.5 $\mu$m and forming a convex in only the horizontal direction are integrally formed at the signal light incident/exit ends of the input and output optical waveguides 312 and 313 highly precisely by an end face forming process using ICP etching.

The normal to the convex surface of each wave front compensation mechanism 319 which has a convex shape faces up by 0.3° with respect to a direction parallel to the silicon substrate 301.

A WSi film layer formed in advance by sputtering, an electric wiring pattern formed by using an electrode forming process after optical waveguide formation, and solder bump pads are formed on the silicon substrate 301, so the semiconductor optical amplifiers 303 are mounted by self-alignment with high aligning precision and drive currents can be injected to the respective channels independently.

A total of 16 V-groove optical fiber guides 320 including eight on the input side and eight on the output side are formed on the two ends of the platform 302 to extend for a length of 2 mm, so optical fibers for inputting and outputting signal light to the input and output optical waveguides 312 and 313 are mounted without alignment at high positioning precision.

The two 4-channel semiconductor optical amplifiers 303 are flip-chip mounted on the optical element mounting regions 318, each through a 10-μm width air gap 314 with respect to the end face 302b, by self-alignment using AnSn solder to be axially symmetrical. A total of two sets of single-mode 8-fiber ribbon optical fibers 321 are passively mounted and fixed with an ultraviolet-curing resin along the total of 16 optical fiber guides.

Figure 4:
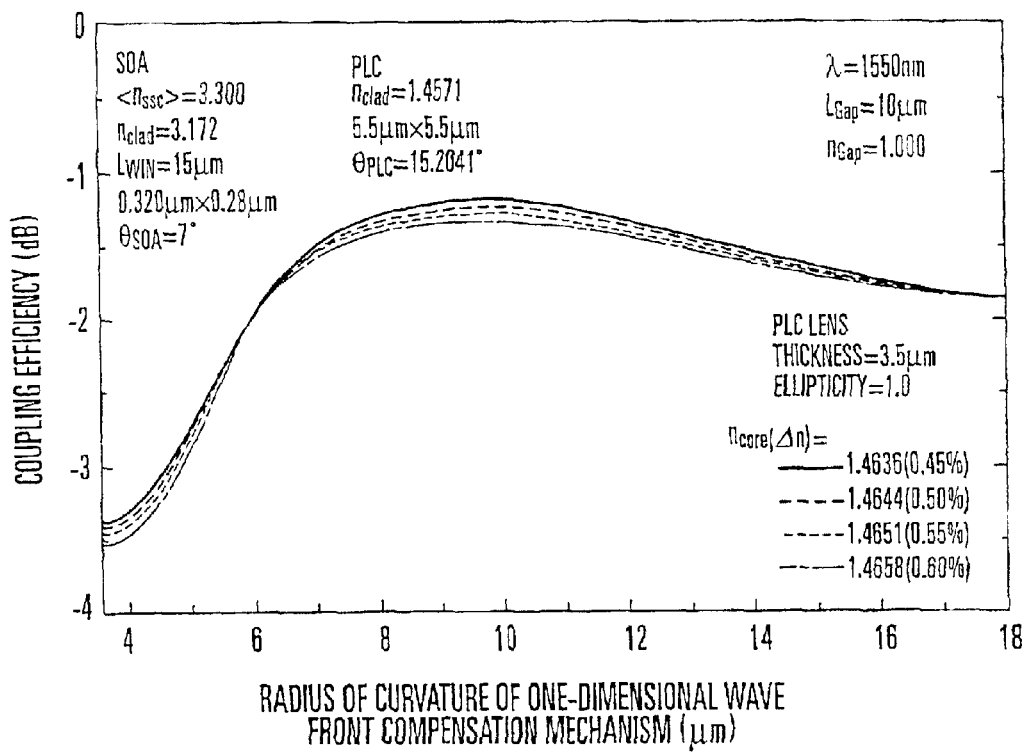
FIG. 4 is a graph showing the correlation between the radius of curvature of a one-dimensional wave front compensation mechanism and the coupling efficiency.

Regarding the coupling efficiency between the input and output optical waveguides 312 and 313 and the semiconductor optical amplifiers 303, as shown in FIG. 4, it was −1.17 dB when the radius of curvature of the wave front compensation mechanism was 10 μm. Thus, good characteristics comparable favorably with those of a case wherein an aspherical lens single body was used were obtained. The respective channels of the semiconductor optical amplifiers 303 were driven. When a module input power was −20 dB and an injected current was 80 mA, a module gain was 30 dB. Thus, good signal light amplification characteristics were obtained.

Using a platform 302 dipped in buffered hydrofluoric acid for 1 min so the distal ends of the core layers of the input and output optical waveguides 312 and 313 projected for about 1 μm, mounting operation identical to that described above was performed. When the characteristics were measured, the coupling efficiency was improved to −0.85 dB.

As has been described above, according to the present invention, the first signal light incident/exit end face of the first end face of an optical waveguide circuit which opposes the second end face of an optical waveguide element has a wave front compensation mechanism for decreasing the curvature of the wave front of the signal passing through it. This can improve the signal light coupling efficiency between the optical waveguide element and optical waveguide circuit, the signal light incident/exit end faces of which oppose each other through an air gap, more effectively than in the prior art. Hence, size reduction, cost reduction, and improvement in mass productivity of an optical module can be realized.

What is claimed is:

1. An integrated optical module characterized by comprising:

an optical waveguide circuit for guiding signal light;

a base with a major surface where said optical waveguide circuit is formed, said base having a first end face where the signal light passing through said optical waveguide circuit emerges and becomes incident;

an optical waveguide element mounted on said base and having a second end face opposing the first end face through a predetermined air gap; and a wave front compensating means formed with said base at a region of the first end face where the signal light becomes incident and emerges, for decreasing a curvature of a wave front of the incident/exit signal light.

2. An integrated optical module comprising:

an optical waveguide circuit for guiding signal light;

a base with a major surface where said optical waveguide circuit is formed, said base having a first end face where the signal light passing through said optical waveguide circuit emerges and becomes incident;

an optical waveguide element mounted on said base and having a second end face opposing the first end face through a predetermined air gap; and a wave front compensating portion formed on said base at a region of the first end face where the signal light becomes incident and emerges, wherein said wave front compensating portion has one of a convex and concave formed on the first end face.

3. A module according to claim 2, wherein said wave front compensating portion is constituted by a cylindrical body formed in a direction perpendicular to a surface of said base and having a side portion projecting toward the second end face.

4. A module according to claim 3, wherein the air gap has a bottom surface parallel to the surface of said base, and the cylindrical body is continuously formed from an upper surface of the base to the bottom surface of the air gap.

5. A module according to claim 4, wherein the cylindrical body is constituted by a partial circular cylinder obtained by cutting a circular cylinder at a certain plane perpendicular to a bottom surface thereof.

6. A module according to claim 1, wherein said wave front compensating means is constituted by a groove formed in a direction perpendicular to a surface of said base and recessed from the first end face.

7. A module according to claim 6, wherein the air gap has a bottom surface parallel to the surface of the base, and the groove is continuously formed from an upper surface of the base to a bottom surface of the air gap.

8. A module according to claim 7, wherein the groove has an arcuate section.

9. An integrated optical module comprising:

an optical waveguide circuit for guiding signal light;

a base with a major surface where said optical waveguide circuit is formed, said base having a first end face where the signal light passing through said optical waveguide circuit emerges and becomes incident;

an optical waveguide element mounted on said base and having a second end face opposing the first end face through a predetermined air gap; and a wave front compensating portion formed on said base at a region of the first end face where the signal light becomes incident and emerges, wherein a waveguide of said optical waveguide element is arranged at a predetermined angle with respect to a perpendicular to the second end face.

10. A module according to claim 1, wherein a waveguide of said optical waveguide element is arranged at an angle of 5° to 7° with respect to a perpendicular to the second end face.

11. A module according to claim 1, wherein said optical waveguide circuit comprises a core layer made of germanium-doped quartz, and a cladding layer made of phosphorus- or boron-doped quartz.

12. A module according to claim 11, wherein said wave front compensating means is formed at an incident/exit end face of the first end face such that the core layer projects from the cladding layer for a length almost corresponding to a wavelength of the signal light.

13. The module according to claim 1, wherein said wave front compensating means has a polyhedron formed on the first end face.

14. The module according to claim 13, wherein the polyhedron is a triangular pyramid.

* * * * *